(12) United States Patent
Dreesen et al.

(10) Patent No.: US 9,529,533 B1
(45) Date of Patent: Dec. 27, 2016

(54) POWER GRID SEGMENTATION FOR MEMORY ARRAYS

(71) Applicant: Apple Inc., Cupertino, CA (US)

(72) Inventors: Michael A. Dreesen, Austin, TX (US); Naveen Javarappa, San Jose, CA (US); Ajay Kumar Bhatia, Saratoga, CA (US); Greg M. Hess, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/177,596

(22) Filed: Jun. 9, 2016

(51) Int. Cl.
| G11C 5/14 | (2006.01) |
| G06F 3/06 | (2006.01) |
| G06F 1/32 | (2006.01) |
| G06F 1/26 | (2006.01) |
| G11C 11/419 | (2006.01) |
| G11C 11/418 | (2006.01) |

(52) U.S. Cl.
CPC .............. *G06F 3/0608* (2013.01); *G06F 1/263* (2013.01); *G06F 1/3296* (2013.01); *G06F 3/0653* (2013.01); *G06F 3/0659* (2013.01); *G06F 3/0673* (2013.01); *G11C 11/418* (2013.01); *G11C 11/419* (2013.01)

(58) Field of Classification Search
CPC ....... G11C 5/14; G11C 5/147; G11C 11/1697; G11C 11/4074
USPC .......................................... 365/226, 154, 156
See application file for complete search history.

(56) References Cited

U.S. PATENT DOCUMENTS

| 7,613,053 | B2 | 11/2009 | van Winkelhoff | |
| 8,327,158 | B2 | 12/2012 | Titiano | |
| 8,599,597 | B2* | 12/2013 | Terzioglu | G11C 7/24 365/104 |
| 9,053,975 | B2 | 6/2015 | Komatsu | |
| 9,123,436 | B2 | 9/2015 | Chiou | |
| 9,189,052 | B2 | 11/2015 | Bhatia | |
| 9,218,873 | B2 | 12/2015 | Nii | |
| 2013/0294149 | A1* | 11/2013 | Deng | G11C 5/14 365/156 |

* cited by examiner

*Primary Examiner* — Huan Hoang
(74) *Attorney, Agent, or Firm* — Meyertons, Hood, Kivlin, Kowert & Goetzel, P.C.

(57) ABSTRACT

An apparatus for modifying a voltage level of a memory array power supply is disclosed. A first column may include a first plurality of data storage cells coupled to a first local power supply signal and a second column may include a second plurality of data storage cells coupled to a second local power supply signal. A first switch may be configured to selectively coupled the first local power supply signal to either a first power signal or a second power supply signal dependent upon a value of a first selection signal, and a second switch may be configured to selectively couple the second local power supply signal to either the first power supply signal or the second power supply signal dependent upon a value of a second selection signal.

20 Claims, 6 Drawing Sheets

POWER GRID SEGMENTATION FOR MEMORY ARRAYS

BACKGROUND

Technical Field

Embodiments described herein are related to the field of memory circuits, and more particularly to the memory array power supply configurations.

Description of the Related Art

Computing systems may include multiple integrated circuits, each of which may include different circuits, such as, e.g., a processor, a radio frequency transceiver, and the like. To reduce chip count for mobile and wearable applications, computing systems may be integrated on a single integrated circuit. A computing system implemented in such a fashion is commonly referred to as a system-on-a-chip or "SoC."

Different circuit blocks included in an SoC may include memory circuits. Memories typically include a number of data storage cells composed of interconnected transistors fabricated on a semiconductor substrate. Such data storage cells may store a single data bit or multiple data bits and may be constructed according to a number of different circuit design styles. For example, the data storage cells may be implemented as a single transistor coupled to a capacitor to form a dynamic storage cell. Alternatively, cross-coupled inverters may be employed to form a static storage cell or a floating gate MOSFET may be used to create a non-volatile storage cell.

To reduce power consumption of memory circuits, some implementations may reduce a voltage level of a power supply coupled to data storage cells in the array of a memory circuit. By reducing the voltage level of the power supply, leakage power during inactive periods may be reduced.

SUMMARY OF THE EMBODIMENTS

Various embodiments of a current monitoring unit are disclosed. Broadly speaking, a circuit and a method are contemplated in which a first column includes a first plurality of data storage cells, and a second column includes a second plurality of data storage cells. Each data storage cell of the first plurality of data storage cells is coupled to a first local power supply signal and each data storage cell of the second plurality of data storage cells is coupled to a second local power supply. A first switch may be coupled to the first local power supply signal, a first power supply signal, and a second power supply signal and be configured to selectively couple the first local power supply signal to either the first power supply signal or the second power supply signal dependent upon a value of a first selection signal. A second switch may be coupled to the second local power supply signal, the first power supply signal, and the second power supply signal and be configured to selectively couple the second local power supply signal to either the first power supply signal or the second power signal dependent upon a value of a second selection signal.

In another embodiment, a decoder circuit may be configured to assert one of the first selection signal or the second selection signal dependent upon an address value.

In another non-limiting embodiment, a power supply circuit may be configured to modify a voltage level of the second power supply signal from a first voltage level to a second voltage level dependent upon a received command.

BRIEF DESCRIPTION OF THE DRAWINGS

The following detailed description makes reference to the accompanying drawings, which are now briefly described.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph (f) interpretation for that unit/circuit/component. More generally, the recitation of any element is expressly intended not to invoke 35 U.S.C. §112, paragraph (f) interpretation for that element unless the language "means for" or "step for" is specifically recited.

DETAILED DESCRIPTION OF EMBODIMENTS

A system on a chip (SoC) may include one or more circuit blocks, such as, e.g., a processor or a memory, which may integrate the function of a computing system onto a single integrated circuit. Depending on their respective intended functions, each circuit block may be designed to operate at power supply voltage levels. Such power supply voltage levels may be adjusted during the course of operation depending on operating mode of the SoC.

Memory circuits may include separate power supplies for data storage cells in the array and peripheral circuits, such as, decoders, for example. In some cases, the voltage level of the power supply for the array may be adjusted during operation. For example, during period of inactivity, the voltage level of the array may be reduced to a low level in order to reduce power consumption resulting from leakage current through the data storage cells. Alternatively, or additionally, the voltage level of the array may be increased during a read operation in order to reduce the likelihood of disturbing the data state of a data storage cell during the read operation.

The aggregate capacitance, including the wiring and transistor load, of the array power supply may be sufficiently large that changing the voltage level of the power array power supply may take considerable time, resulting in a degradation in performance. The embodiments illustrated in the drawings and described below may provide techniques to adjust the voltage level of a memory array power supply while reducing the time to adjust the voltage level.

Figure 1:
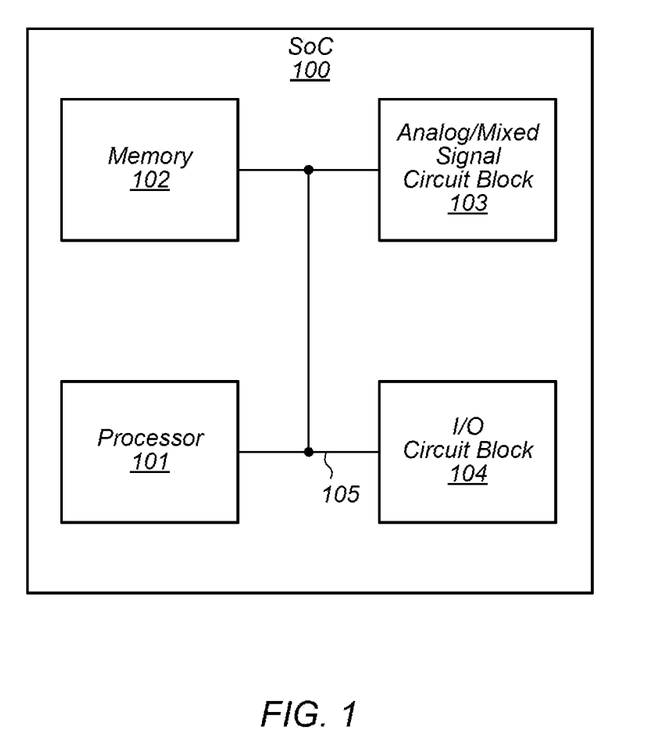
FIG. 1 illustrates an embodiment of a system-on-a-chip.

A block diagram of an SoC is illustrated in FIG. 1. In the illustrated embodiment, the SoC 100 includes a Processor 101 coupled to Memory 102, and Analog/Mixed-Signal Circuit Block 103, and I/O Circuit block 104 through internal bus 105. In various embodiments, SoC 100 may be configured for use in a mobile computing application such as, e.g., a tablet computer, cellular telephone, or wearable device.

Processor 101 may, in various embodiments, be representative of a general-purpose processor that performs computational operations. For example, Processor 101 may be a central processing unit (CPU) such as a microprocessor, a microcontroller, an application-specific integrated circuit (ASIC), or a field-programmable gate array (FPGA). In some embodiments, Processor 101 may include one or more register files and memories. Processor 101 may also be a computing complex having one or more processors or processor cores therein.

In some embodiments, processor 201 may implement any suitable instruction set architecture (ISA), such as, e.g., the PowerPC™, ARM™ or x86 ISAs, or combination thereof. Processor 201 may include one or more bus transceiver units that allow processor 201 to communication to other functional blocks within SoC 200 such as, memory block 202, for example.

Memory 102 may include any suitable type of memory such as a Dynamic Random Access Memory (DRAM), a Static Random Access Memory (SRAM), a Read-only Memory (ROM), Electrically Erasable Programmable Read-only Memory (EEPROM), a FLASH memory, or a Ferro-electric Random Access Memory (FeRAM), for example. In some embodiments, Memory 102 may be configured to store program code or program instructions that may be executed by Processor 101. Memory 102 may, in other embodiments, be configured to store data to be processed, such as graphics data, for example.

It is noted that in the embodiment of an SoC illustrated in FIG. 1, a single memory is depicted. In other embodiments, any suitable number of memory blocks and memory types may be employed.

Analog/Mixed-Signal Circuit Block 103 may include a variety of circuits including, for example, a crystal oscillator, a phase-locked loop (PLL) or delay-locked loop (DLL), an analog-to-digital converter (ADC), and a digital-to-analog converter (DAC) (all not shown). In other embodiments, Analog/Mixed-Signal Circuit Block 103 may be configured to perform power management tasks with the inclusion of on-chip power supplies, voltage regulators, and clock frequency scaling circuitry. Analog/Mixed-Signal Circuit Block 103 may also include, in some embodiments, radio frequency (RF) circuits that may be configured for operation with cellular telephone networks.

I/O Circuit Block 104 may be configured to coordinate data transfer between SoC 100 and one or more peripheral devices. Such peripheral devices may include, without limitation, storage devices (e.g., magnetic or optical media-based storage devices including hard drives, tape drives, CD drives, DVD drives, etc.), audio processing subsystems, graphics processing subsystems, or any other suitable type of peripheral devices. In some embodiments, I/O Circuit Block 104 may be configured to implement a version of Universal Serial Bus (USB) protocol or IEEE 1394 (Firewire®) protocol, and may allow for program code and/or program instructions to be transferred from a peripheral storage device for execution by Processor 101.

I/O Circuit Block 104 may also be configured to coordinate data transfer between SoC 100 and one or more devices (e.g., other computing systems or SoCs) coupled to SoC 100 via a network. In one embodiment, I/O Circuit Block 104 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, I/O Circuit Block 104 may be configured to implement multiple discrete network interface ports.

It is noted that the SoC illustrated in FIG. 1 is merely an example. In other embodiments, different circuit blocks and different configurations of circuit blocks may be possible dependent upon the specific application for which the SoC is intended. It is further noted that the various circuit blocks illustrated in SoC 100 may operate at different clock frequencies, and may require different power supply voltages.

Figure 2:
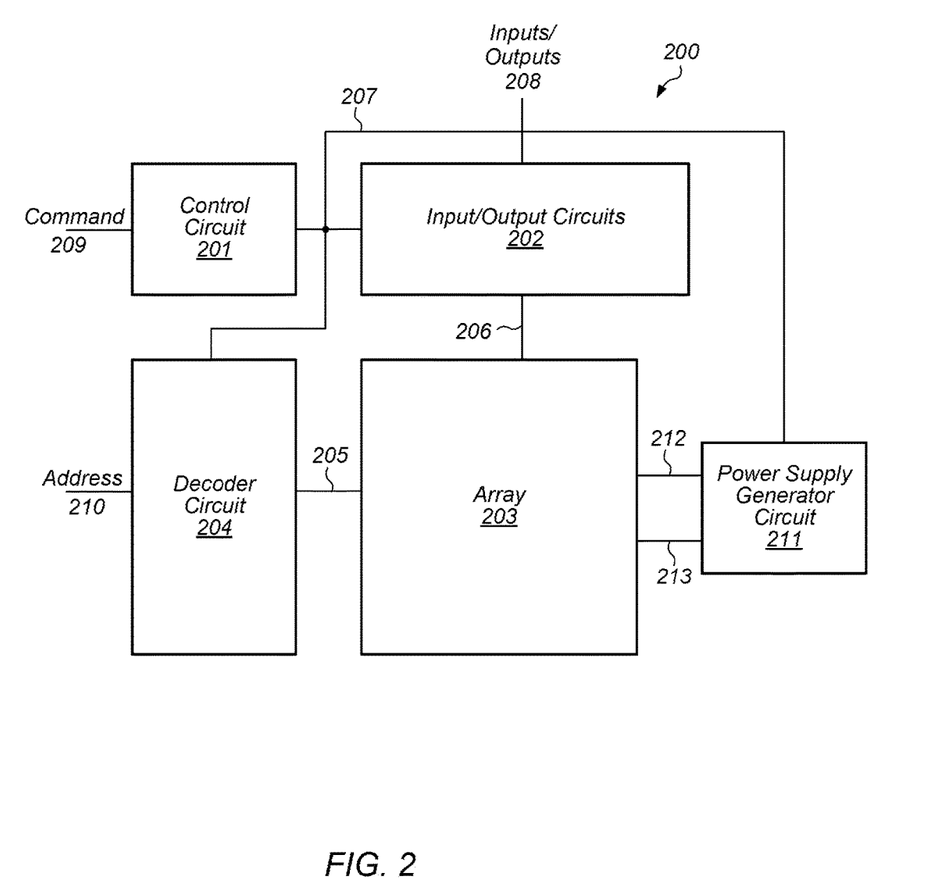
FIG. 2 illustrates an embodiment of a memory.

A block diagram depicting an embodiment of a memory is illustrated in FIG. 2. The illustrated embodiment may, in various embodiments, correspond to memory 102 of the embodiment depicted in FIG. 1. In the illustrated embodiment, memory 200 includes Control Circuit 201, Input/Output Circuits 202, Decoder Circuit 204, Array 203, and Power Supply Generator 211.

Array 203 may include multiple data storage cells arranged in a matrix of rows and columns organized in to a set of banks. Each data storage cell may be configured to store one or more data bits, and may be designed in accordance with one of various design styles. For example, the data storage cells may include SRAM, DRAM, or ROM memory cells. Power terminals on each memory cell may be connected to local power supply signals included in Array 203 which are, in turn, coupled to one of power supplies 212 and 213 dependent upon row and column selection signals 205.

Control circuit 201 may include logic circuits and/or sequential logic circuits configured to generate timing and control signals 207 to operate circuits included in Input/Output Circuits 202 and Decoder Circuit 204. Such timing and control signals may include signals to activate sense amplifiers, data input latches, data output latches, and the like based on Command 209.

Input/Output Circuits 202 are coupled to Inputs/Outputs 208. In various embodiments, Input/Output Circuits 202 may include multiple latches for capturing data to be stored in Array 203, as well as amplifiers to convert signals received from Array 203 into digital signals during read operations.

Decoder Circuit 204 may assert a given one of multiple row and column selection signals 205 dependent upon Address 210 input to memory 200. In various embodiments, a given row selection signal (also referred to herein as "word lines") may be asserted dependent upon a portion of the address, while a given column selection signal may be asserted dependent upon a different portion of the address. It is noted that although a single wire is depicted for row and column selection signals 205, any suitable number of wires may be employed.

Power Supply Generator Circuit 211 may include any suitable circuits, such as, e.g., regulators circuits, for generating voltage levels on power supplies 212 and 213. In some embodiments, Power Supply Generator Circuit 211 may be configured to adjust the voltage level of one of power supplies 212 and 213 dependent upon Command 209. Control Circuit 201 may transmit information regarding a type of operation to be performed via control signals 207 to Power Supply Generator Circuit 211. In various embodiments, Power Supply Generator Circuit 211 may generate a particular voltage on one of power supplies 212 and 213 when Command 209 indicates a read operation, and a different voltage level on the on power supplies 212 and 213 when Command 209 indicates a write operation. It is noted that although only two power supplies (i.e., power supplies 212 and 213) are illustrated, in other embodiments, Power Supply Generator Circuit 211 may generate any suitable number of power supplies, each with a different voltage level.

It is noted that the embodiment illustrated in FIG. 2 is merely an example. In other embodiments, different memory architectures are possible and contemplated.

Figure 3:
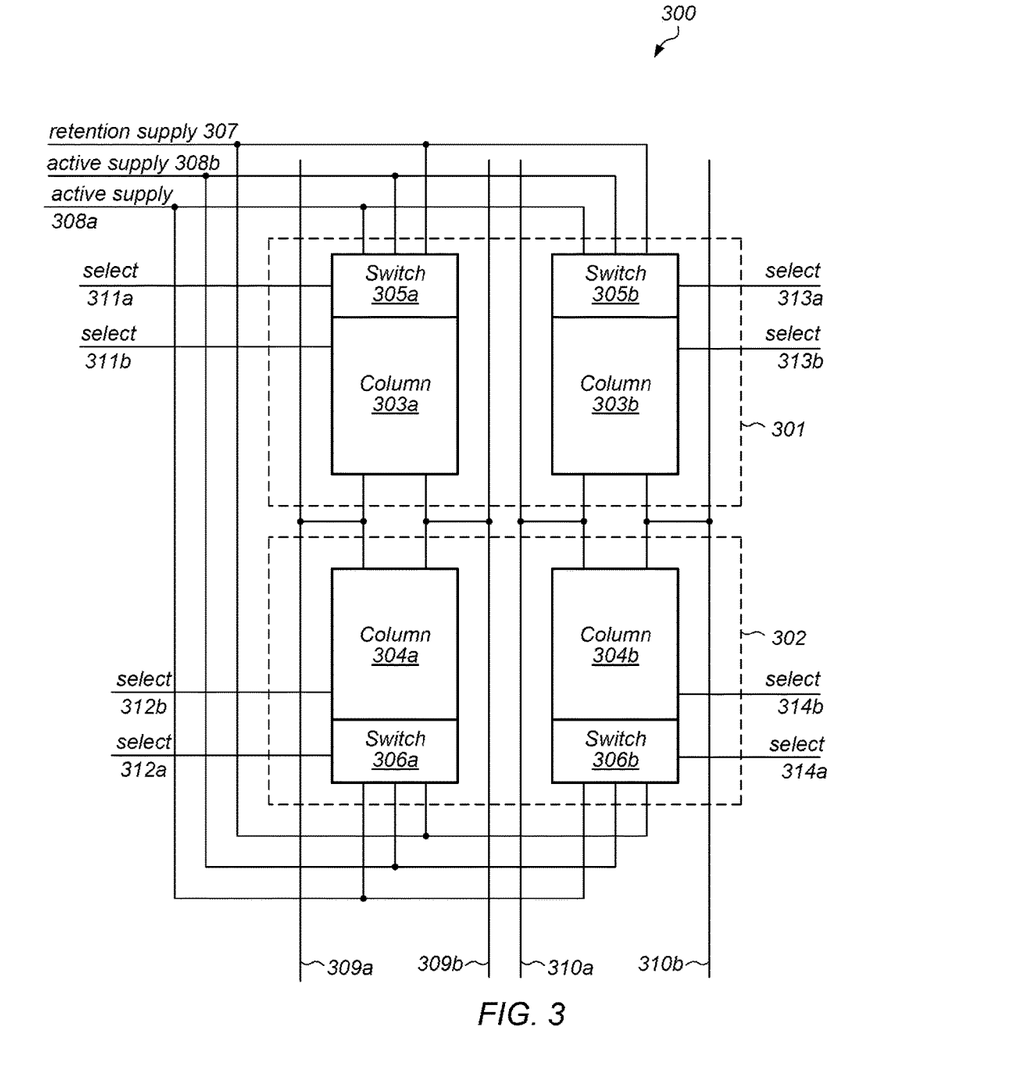
FIG. 3 illustrates an embodiment of a memory array.

Turning to FIG. 3, an embodiment of a memory array is illustrated. In various embodiments, array 300 may correspond to Array 203 as depicted in the embodiment of FIG. 2. In the illustrated embodiment, bank 301 and bank 302. Bank 301 includes Columns 303a-b and Switches 305a-b, and bank 302 includes Columns 304a-b and Switches 306a-b. Although only two columns are depicted as being included in a given bank, it is noted that, in other embodiments, any suitable number of columns may be employed.

Each of Columns 303a-b and 304a-b may include multiple data storage cells (not shown). Data storage cells included in Column 303a and Column 304a may be coupled to bit lines 309a-b, and data storage cells included in Column 303b and Column 304b may be coupled to bit lines 310a and 310b. Although pairs are bit lines are depicted in the embodiment of FIG. 3, in other embodiments, a particular set of columns may be coupled to a corresponding single bit line. As described below, in more detail, data storage cells within a particular column may be coupled to a common local power supply.

A particular data storage in one of Columns 303a-b and 304a-b may be selected by one of select 311b, 312b, 313b, and 314b. In various embodiments, select 311b, 312b, 313b, and 314b may correspond to row and column selection signals 205 as illustrated in the embodiment of FIG. 2. The assertion of one of select 311b, 312b, 313b, and 314b, may select a particular data storage cell from which data may be read, or into which data may be stored. In some embodiments, only one selection signal for a set of columns coupled to a common set of bit lines may be activated at one time. For example, if select 311b is asserted, then select 312b cannot be asserted. By organizing array 300 in this fashion, only a portion of array 300 may be coupled to one of active supplies 308a-b during an operation, thereby leaving the rest of array 300 coupled to retention supply 307 in order to save power.

In various embodiments, a voltage level of retention supply 307 may be sufficient to allow data storage cells in Columns 303a-b and 304a-b to maintain storage of data, but be insufficient to access the data storage cells. At the time of a read or write operation, the local power supply of a column selected by one of select 311a-b, 312a-b, 313a-b, and 314a-b, may be coupled to active supply 308. The voltage level of active supply 308a may then be adjusted to allow access to a data storage cell in the selected column. In some cases, circuitry, such as, e.g., Power Supply Generator Circuit 211, may adjust the voltage level of active supply 308a to different levels depending on if the operation is a read operation or a write operation. Once the operation has been completed, the voltage level of active supply 308a may return to a level substantially the same as retention supply 307 before the selected column is de-selected. In other embodiments, a voltage level of active supply 308b may also be adjusted. Alternatively, or additionally, active supply 308a may be used during one type of operation, such as a read or write, for example, while active supply 308b may be used for a different type of operation.

Each of Switches 305a-b and 306a-b are coupled to retention supply 307 and active supply 308. Switches 305a-b are controlled by select 311a and 313b, respectively, and Switches 306a-b are controlled by select 312a and 314a, respectively. It is noted that select 311a, 313b, 312a, and 314b, may correspond to row and column selection signals 305 as depicted in FIG. 2, in some embodiments. In response to changes in value of select 311a, 313b, 312a, and 314b, Switches 305a-b and 306a-b, selectively couple corresponding local power supplies (not shown) included in Column 303a-b and 304a-b to either of retention supply 307, active supply 308a, or active supply 308b. In various embodiments, retention supply 307 and active supply 308 may correspond to power supplies 212 and 213 as illustrated in the embodiment of FIG. 2.

Although only two banks are depicted in the embodiment illustrated in FIG. 3, it is noted that, in other embodiments, any suitable number of banks may be employed.

Figure 4:
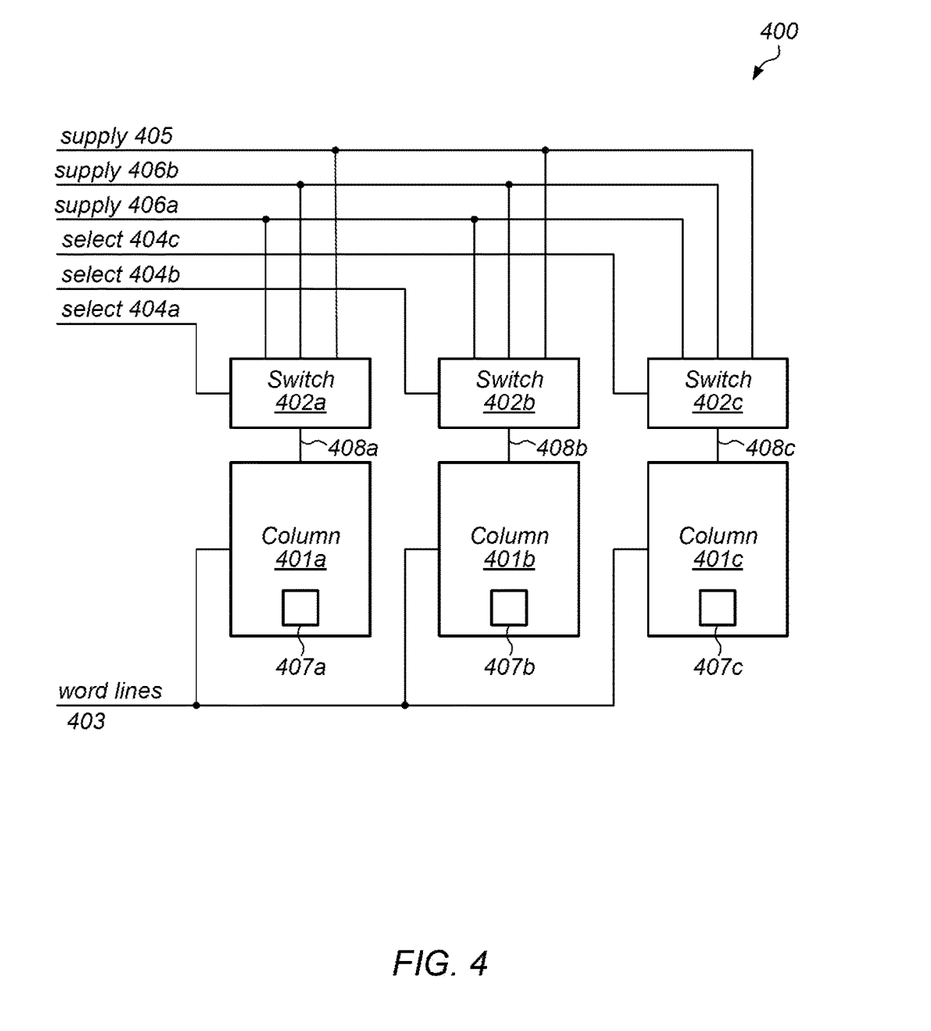
FIG. 4 illustrates an embodiment of a memory sub-bank.

An embodiment of a memory array bank, such as, e.g., bank 301 as illustrated in FIG. 3, is depicted in the block diagram of FIG. 4. In the illustrated embodiment, bank 400 includes Columns 401a-c, and Switches 402a-c. Each of Columns 401a-c include data storage cells 407a-c, respectively. Power terminals on each of data storage cells 407a-c may be coupled to local power supplies 408a-c, respectively. Although only a single data storage cell is shown in each of Columns 401a-c, in other embodiments, any suitable number of data storage cells may be included in each of Columns 401a-c.

Switches 402a-c are coupled to Columns 401a-c via local power supplies 406a-c, respectively. Each of Switches 402a-c are further coupled to supply 405, supply 406a, and supply 406b. In various embodiments, supply 405 may correspond to retention supply 307, and supplies 406a-b may correspond to active supplies 308a-b, respectively, as illustrated in FIG. 3. In various embodiments, the voltage level on supply 405 may correspond to a retention supply level for data storage cells 407a-c.

Prior to receiving a command and address for an operation, each of select 404a-c may be de-asserted. With none of select 404a-c asserted, Switches 402a-c may couple each of local power supplies 408a-c to supply 405. As described below, in more detail, when a command and address are received, the address may be decoded, and one of select 404a-c may be asserted. In response to the assertion of one of select 404a-c, the corresponding one of Switches 402a-c may couple it respective local power supply to one of supplies 406a-b. For example, if select 404a is asserted, then Switch 402a may couple local power supply 408a to supply 406a, leaving local power supplies 408a and 408c coupled to supply 405.

As used and described herein "asserted" describes the state of signal that results in a receiving circuit performing a particular operation. In some cases, an asserted signal may be at a high logic level, while, in other embodiments, an asserted signal may be at a low logic level (commonly referred to as an "active low" signal).

Once a particular one of local power supplies 408a-c has been coupled to one of supplies 406a-b, the voltage level on the selected one of supplies 406a-b may be adjusted. In some embodiments, an initial voltage level on the selected one of supplies 406a-b may be substantially the same as a voltage level of supply 405. The adjusted voltage level, higher or lower, on the selected one of supplies 406a-b may, in various embodiments, dependent on the type of operation being performed. One voltage level may be used for read operations, while another voltage level may be used for write operations.

When the selected one of supplies 406a-b has reached its desired voltage level, one of word lines 403 may be asserted selecting a specific data storage cell in the selected column. Data may then be read from or written to the specific data storage cell in the selected column. Once the read or write operation has been completed, the asserted one of word lines 403 may be de-asserted. Additionally, the asserted one of select 404a-c may also be de-asserted. Prior to the de-assertion of the asserted one of select 404a-c, the voltage level of the selected one of supplies 406a-b may be return to the initial voltage level. Although word lines 403 are depicted by a single wire, in other embodiments, any suitable number of wires may be employed, each of which may be coupled to a corresponding data storage cell included in Columns 401a-c.

It is noted that the embodiment illustrated in FIG. 4, is merely an example. In other embodiments, any suitable number of columns and switches may be employed.

Figure 5:
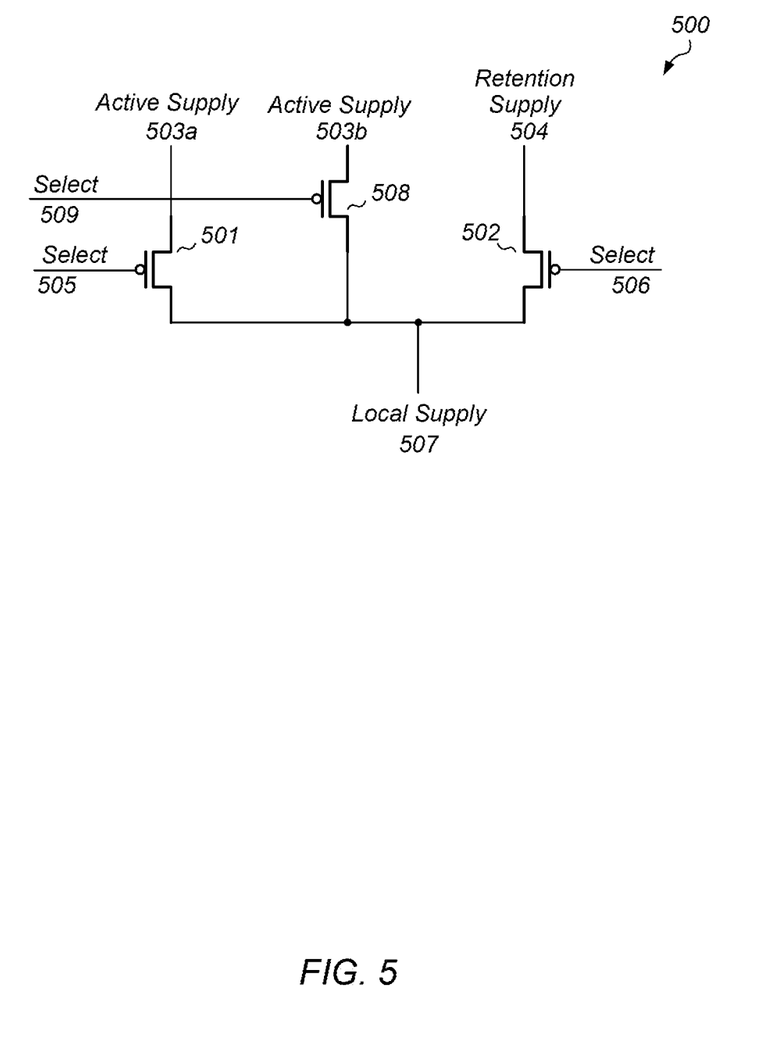
FIG. 5 illustrates an embodiment of a switch circuit.

Turning to FIG. 5, an embodiment of a switch circuit is illustrated. In various embodiments, switch circuit 500 may correspond to any of switch circuits 402a-c as illustrated in FIG. 4. In the illustrated embodiment, switch circuit 500 includes transistors 501, 502, and 508. Transistor 501 is coupled between Active Supply 503a and Local Supply 507. The control terminal of transistor 501 is coupled to Select 505. Transistor 502 is coupled between Retention Supply 504 and Local Supply 507. The control terminal of transistor 502 is coupled to Select 506. Transistor 508 is coupled between Active Supply 503b and Local Supply 507. The control terminal of transistor 508 is coupled to Select 509. It is noted that, in some embodiments, transistors 501, 502, and 508 may each be a p-channel metal-oxide semiconductor field-effect transistor (MOSFET), or any other suitable transconductance device.

During operation, Select 506 may be at a low logic level, and Select 505 and Select 509 may both be at a high logic level. As described above, a memory may receive a command and address. A decoder circuit included in the memory may decode the address to generate decoded signals, such as, e.g., word lines, column selections, and the like. In response to the decoding of the address, Select 506 may transition to a high logic level, and Select 505 may transition to a low logic level. Alternatively, Select 505 may remain at a high logic level and Select 509 may transition to a low logic level.

It is noted that "low" or "low logic level" refers to a voltage at or near ground and that "high" or "high logic level" refers to a voltage level sufficiently large to turn on a n-channel MOSFET and turn off a p-channel MOSFET. In other embodiments, different technology may result in different voltage levels for "low" and "high."

Once Select 506 is at a high logic level and Select 505 is a low logic level, and Select 509 is at a high logic level the voltage level of Active Supply 503a may then be adjusted. For example, when the received command is a read command, the voltage level of Active Supply 503a may be increased to assist in reading a selected memory cell. Alternatively, if the received command is a write command, the voltage level of Active Supply 503a may be decreased to assisting in storing new data in the selected memory cell. It is noted that in some embodiments, Select 509 may transition to a low logic level instead of Select 505. In such cases, the voltage level of Active Supply 503b may be adjusted in a similar fashion to Active Supply 503a. In other embodiments, the voltage levels of Active Supply 503a and 503b may be different or adjusted different and the selection of which supply to use may depend on a type of operation being performed, such as a read or write operation, for example.

Upon completion of the operation specified by the received command, Select 505 may return to a high logic level, and Select 506 may return to a low logic level, decoupling Local Supply 507 from Active Supply 503a and coupling Local Supply 507 Retention Supply 504. In some embodiments, the voltage level of Active Supply 503a may be returned to a voltage level similar to the voltage level of Retention Supply 504 prior to re-coupling Local Supply 507 to Retention Supply 504.

The embodiment of a switch circuit depicted in FIG. 5 is a particular example of a switch circuit. In other embodiments, different numbers of transistors and different arrangements of transistors may be employed. For example, in some cases, a switch circuit may include an inverter, or any other suitable type of inverting amplifier, to locally generate Select 505 by inverting Select 506, or vice versa. In some embodiments, additional circuitry (not shown) may be used to generate signals Select 505, 506, and 509 dependent upon column address data and data indicative of a type of operation being performed.

Figure 6:
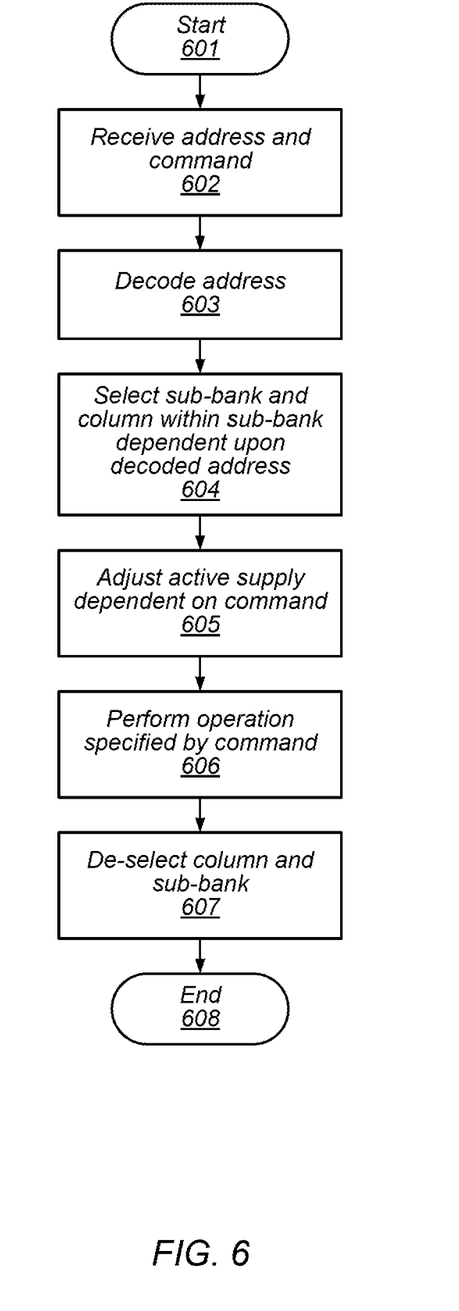
FIG. 6 illustrates a flow diagram depicting an embodiment of a method for operating a memory.

A method for operating a memory is depicted in the flow diagram illustrated in FIG. 6. The method begins in block 601. A memory, such as, e.g., memory 200 as depicted in FIG. 2, may be a pre-charge state, where local supplies of the various columns included in the sub-banks of the memory's array are coupled to a retention power supply, such as Retention Supply 307, for example. A voltage level of the retention supply may be selected in order to reduce leakage current in data storage cells included in the columns, while still preserving the data stored in the data storage cells. Additionally, a voltage level of an active supply, such as, e.g., Active Supply 308a, may be set to a level similar to the voltage level of the retention supply.

A command and an address may then be received (block 602). The received address may specify one or more data storage cells upon which to perform an operation specified by the received command. In various embodiments, a control circuit, such as, control circuit 201, may receive the command, while a decoder, such as, decoder 204, may receive the address.

The received address may then be decoded (block 603). A decoder circuit, such as decoder 204, may decode the received address to generate selection signals to select specific data storage cells upon which to perform the desired operation. Based on the selection signals, a column within a particular sub-bank may be selected (block 604). For example, in the embodiment illustrated in FIG. 3, column 303a within sub-bank 301 may be selected. When the column within the particular sub-bank is selected, a switch circuit, such as, e.g., switch circuit 500 as illustrated in FIG. 5, may couple the local power supply of the selected column to the active power supply of the memory.

Once a column within a sub-bank has been selected, a voltage level of the active power supply may be modified dependent upon the operation specified in the received command (block 605). Since the local supply of the selected column is coupled to the active power supply, the voltage level of the local supply will track the change in voltage level of the active supply. For example, if the specified operation is a read operation, the voltage level of the active supply may be increased to assist in reading data from a particular data storage cell included in the selected column. Alternatively, when a write operation is specified by the received command, the voltage level of the active supply may be decreased to make it easier to store new data in the particular data storage cell. By modifying the voltage level of the active supply after it has been coupled to the local supply of the selected column, a time required to change the voltage level may be decreased, improving performance. Moreover, by leaving the local supplies of unselected columns couple to the retention supply, leakage power may be reduced in the unselected columns.

When the active power supply, and the local supply of the selected column, has reached the desired voltage level, the operation specified by the received command may then be performed (block 606). Upon completion of the operation, the selected column and sub-bank may then be de-selected (block 607). When the selected column is de-selected, the switch included in the column may de-couple the local power supply of the column from the active supply, and couple the local supply to the retention supply. In some embodiments, prior to de-coupling the local supply from the active supply, the voltage level of the active supply may be adjusted. For example, the voltage level of the active supply may be adjusted to be substantially the same the voltage level of the retention power supply. Once the selected column has been de-selected, the method may conclude in block 608.

Although the operations are depicted as being performed in a sequential fashion, in other embodiments, one or of the operations may be performed in parallel.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
a first column including a first plurality of data storage cells, wherein each data storage cell of the first plurality of data storage cells is coupled to a first local power supply signal;
a second column including a second plurality of data storage cells, wherein each data storage cell of the second plurality of data storage cells is coupled to a second local power supply signal;
a first switch coupled to the first local power supply signal, a first power supply signal and a second power supply signal, wherein the first switch is configured to selectively couple the first local power supply signal to either the first power supply signal or the second power supply signal dependent upon a value of a first selection signal; and
a second switch coupled to the second local power supply signal and the first power supply signal and the second power supply signal, wherein the second switch is configured to selectively couple the second local power supply signal to either the first power supply signal or the second power signal dependent upon a value of a second selection signal.

2. The apparatus of claim 1, further comprising a decoder circuit configured to assert one of the first selection signal or the second selection signal dependent upon an address value.

3. The apparatus of claim 1, further comprising a power supply circuit configured to modify a voltage level of the second power supply signal from a first voltage level to a second voltage level dependent upon a received command.

4. The apparatus of claim 3, wherein the power supply circuit is further configured to generate a third voltage level on the first power supply signal.

5. The apparatus of claim 3, wherein the second voltage level is greater than the first voltage level.

6. The apparatus of claim 1, wherein each data storage cell of the plurality of data storage cells includes a Static Random Access Memory (SRAM) memory cell.

7. A method, comprising:
receiving an address and a command, wherein the command includes information indicative of a type of operation;
asserting at least on selection signal dependent upon the address;
selecting a given column of a plurality of columns of a given bank of a plurality of banks in response to the assertion of the at least one selection signal, wherein each column of the plurality of columns includes a plurality of data storage cells, wherein each data storage cell is coupled to a local power supply;
coupling the local power supply of the given column from a first power supply signal to a second power supply signal;
modifying a voltage level of the second power supply signal dependent upon the type of operation;
performing an operation dependent upon the type of operation; and
coupling the local power supply signal of the given column included in the given bank from the second power supply signal to the first power supply signal in response to determining the operation has completed.

8. The method of claim 7, wherein asserting the at least one selection signal dependent upon the address comprises decoding the address.

9. The method of claim 7, wherein modifying the voltage level of the second power supply signal includes decreasing the voltage level of the second power supply signal in response to determining that the type of operation specifies a write operation.

10. The method of claim 7, wherein modifying the voltage level of the second power supply signal includes increasing the voltage level of the second power supply signal in response to determining that the type of operation specifies a read operation.

11. The method of claim 10, wherein coupling the local power supply signal of the given column included in the given bank includes restoring the voltage level of the second power supply signal to an initial voltage level prior to coupling the local power supply signal to the first power supply signal.

12. The method of claim 7, wherein coupling the local power supply of the given column from the first power supply signal to the second power supply signal comprises deactivating a first transistor coupled between the local power supply and the first power supply signal, and activating a second transistor coupled between the local power supply and the second power supply signal.

13. The method of claim 7, wherein each data storage cell of the plurality of data storage cells comprises a Static Random Access Memory (SRAM) data storage cell.

14. A system, comprising:
a processor configured to generate a command and an address; and
a memory including a plurality of banks, wherein each bank of the plurality of banks includes a plurality of columns, wherein each column of the plurality of columns includes a plurality of data storage cells, and wherein the memory is configured to:
receive the command and the address;
couple a local power supply signal of a given column of the plurality of columns from a first power supply signal to a second power supply signal dependent upon the address;
modify a voltage level of the second power supply signal dependent upon an operation specified in the command;
perform the operation specified in the command; and
couple the local power supply signal of the given column from the second power supply signal to the first power supply signal in response to a determination that the operation has been performed.

15. The system of claim 14, wherein to modify the voltage level of the second power supply signal dependent upon the operation specified in the command, the memory is further configured to increase the voltage level of the second power supply in response to a determination that the operation specified in the command includes a read operation.

16. The system of claim 14, wherein to modify the voltage level of the second supply signal dependent upon the operation specified in the command, the memory is further configured to decrease the voltage level of the second power supply signal in response to a determination that the operation specified in the command includes a write operation.

17. The system of claim 14, wherein to couple the local power supply signal of the given column from the second power supply signal to the first power supply signal, the memory is further configured to restore the voltage level of the second power signal to an initial level.

18. The system of claim 14, wherein to couple the local power supply signal of the given column from the first power supply signal to the second power signal, the memory is further configured decode the address.

19. The system of claim 18, wherein to decode the address, the memory is further configured to decode a first number of bits included in the address to assert one of a first subset of a plurality of selection signals, and decode a second number of bits included in the address to assert one of a second subset of the plurality of selection signals, wherein the second number of bits is different than the first number of bits, and wherein the second subset of the plurality of selection signals is different than the first subset of the plurality of selection signals.

20. The system of claim 14, wherein each data storage cell of the plurality of data storage signals includes a Static Random Access Memory (SRAM) data storage cell.

* * * * *